(12) United States Patent
Harada (10) Patent No.: US 6,373,420 B1
(45) Date of Patent: Apr. 16, 2002

(54) ANALOG-TO-DIGITAL CONVERTER WITH CAPABILITY OF OUTPUTTING COMPARISON RESULTS ON BIT AT A TIME DURING TESTING

(75) Inventor: Hisashi Harada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/612,625

(22) Filed: Jul. 7, 2000

(30) Foreign Application Priority Data

Jan. 20, 2000 (JP) .......................................... 12-011991

(51) Int. Cl.[7] .............................................. H03M 1/12
(52) U.S. Cl. .......................................... 341/155; 330/2
(58) Field of Search ................................ 341/155, 120, 341/118; 330/2

(56) References Cited

U.S. PATENT DOCUMENTS

| 5,457,696 A | * | 10/1995 | Mori | 371/21.3 |
| 5,928,373 A | * | 7/1999 | Yoo | 714/719 |
| 6,229,472 B1 | * | 5/2001 | Nishida | 341/161 |

FOREIGN PATENT DOCUMENTS

| JP | 58-60824 | 4/1983 | ........ H03K/13/22 |
| JP | 3-1616 | 1/1991 | ........... H03M/1/10 |
| JP | 11168380 A | * 6/1999 | ........... H03M/1/10 |

* cited by examiner

*Primary Examiner*—Peguy Jeanpierre
(74) *Attorney, Agent, or Firm*—Burns, Doane, Swecker & Mathis, LLP

(57) ABSTRACT

An analog-to-digital converter comprising: an amplifier group for comparing a plurality of reference voltages with an analog voltage of an input analog signal, the amplifier group being composed of a plurality of individual amplifiers, an encoder for generating a digital code corresponding to the results of the comparison made in each of the amplifiers of the amplifier group, and a comparison-result output means which, when executing the test of the amplifier group, inputs all the results of the comparison made in each of the amplifiers together, and sequentially outputs these comparison results per one bit for each time, wherein the comparison-result output means may be a shift register that first inputs results of the comparison made in the amplifier group all at once, and thereafter outputs the thus input results of the comparison made in a plurality of amplifiers per one bit for each time in synchronization with the clock signals.

7 Claims, 3 Drawing Sheets

FIG.5
(PRIOR ART)

ANALOG-TO-DIGITAL CONVERTER WITH CAPABILITY OF OUTPUTTING COMPARISON RESULTS ON BIT AT A TIME DURING TESTING

BACKGROUND OF THE INVENTION

1. Field of the Invention

The present invention relates to an analog-to-digital converter either of the type that converts the whole bits together, or of the type that converts only several bits at one time.

2. Description of the Related Art

Figure 5:
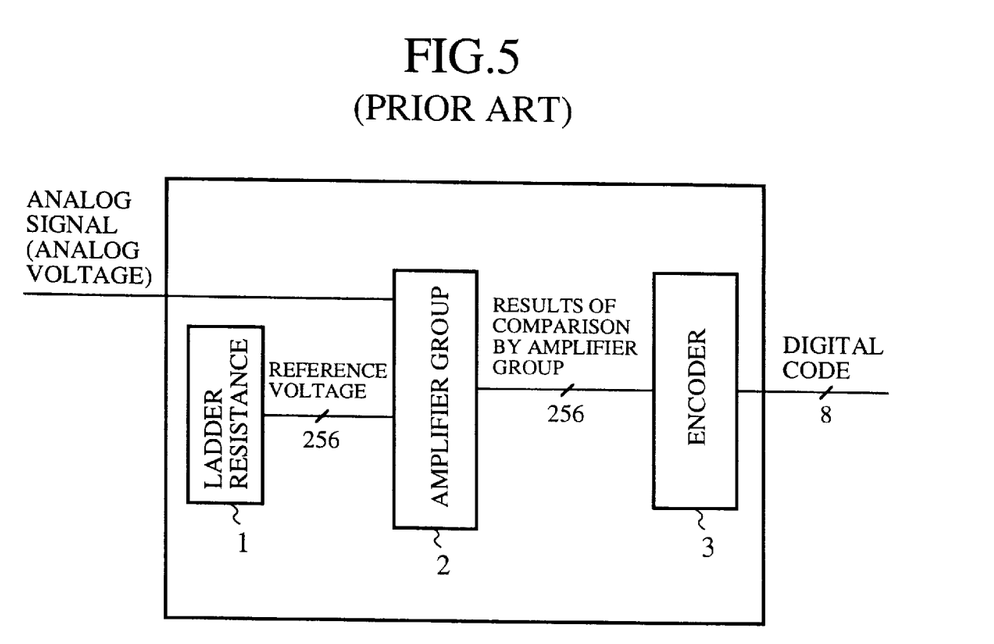
FIG. 5 is a schematic diagram showing the conventional A/D converter.

FIG. 5 is a schematic diagram showing a conventional analog-to-digital converter (hereinafter may be referred to just as an A/D converter), namely an 8-bit flash type converter. In the figure, reference numeral 1 denotes a ladder resistance for variably generating 256 types of reference voltages, numeral 2 denotes an amplifier group composed of 256 amplifiers, each of which compares the analog voltage of an input analog signal that is to be A/D converted with the reference voltages, whenever an analog signal is fed thereto, and numeral 3 denotes an encoder for generating an 8-bit digital code corresponding to the results of the comparison made in each of the 256 amplifiers configuring the amplifier group 2.

The operation of the conventional A/D converter is as follows.

Conventionally, there have been provided various analog-to-digital converters for converting an analog signal to a digital signal at high speed, such as a flash A/D converter that converts the whole bits together, and the one that converts only several bits at one time and so on.

As these types of A/D converters convert the whole bits together or a plurality of bits at one time, they require as many amplifiers as the n-time multiplied value of 2, wherein n corresponds to the number of bits to be converted, so that in the case of an 8-bit flash A/D converter for example, as many as $2^8$, namely 256 amplifiers are required.

In the flash A/D converter shown in FIG. 5, an analog signal is converted to a digital signal in the following manner.

First of all, when the ladder resistance 1 generates arbitrary reference voltages, the amplifier group 2 made of 256 amplifiers externally inputs an analog signal that is to be A/D converted, and compares the thus generated reference voltages with the analog voltage of the input analog signal, and thereafter outputs the results of the comparison made in each of the 256 amplifiers configuring the amplifier group 2 to the encoder 3.

When the encoder 3 receives the results of the comparison made in these 256 amplifiers, it generates an 8-bit digital code corresponding to the results of the comparison, and then outputs externally the thus generated digital code as a digital signal representing the result of the A/D conversion.

It is to be noted that although it is required to test the amplifier group 2 or the encoder 3 before delivering the A/D converter, if the test is conducted in such a manner that the analog voltage of an input analog signal is varied gradually, and the digital signal output from the encoder 3 is checked, malfunction of the 256 amplifiers configuring the amplifier group 2 (for example that of the transistors configuring the 256 amplifiers) can be detected.

Since the conventional A/D converter is configured as such, if the digital signal output from the encoder 3 is checked by gradually varying the analog voltage of an input analog signal, malfunction of the 256 amplifiers configuring the amplifier group 2 can be detected. However, as the result of the comparison made in the amplifier group 2 cannot be directly observed under the condition that the encoder 3 is not functioning properly, the judgement as to whether the amplifiers are properly functioning is not perfectly reliable.

In addition, the encoder 3 is normally provided with a built-in error correction circuit, which corrects output values fed from the amplifiers in the case where the outputs of one or more than one amplifiers are inverted to be an unexpected value due to a noise or the like. Subsequently, in the case where the encoder 3 including an error correction circuit therein is employed, even if the digital signal output from the encoder 3 is checked, the judgment as to whether the amplifiers configuring the amplifier group are functioning properly is not perfectly reliable due to this correction.

It is to be noted that apart from this conventional example, microcomputers, which does not detect malfunction of the amplifier group 2 within the A/D converter, but detects the overall entire A/D converter have been disclosed in Japanese Patent Applications Laid-Open No. 3-1616, and also No. 58-60824.

The present invention has been proposed to solve the problems aforementioned, and it is an object of the present invention to provide an A/D converter that is capable of properly evaluating the function of the amplifiers configuring the amplifier group provided therein.

SUMMARY OF THE INVENTION

In order to achieve the above object, an analog-to-digital converter according to a first aspect of the present invention is constructed in such a manner that it comprises a comparison-result output means which, when executing the test of the amplifier group, inputs all the results of the comparison made in each of the amplifiers configuring the amplifier group together, and sequentially outputs the thus received results per one bit for each time.

In the above construction, the comparison-result output means is composed of a shift register that first inputs all the results of the comparison made in the amplifier group together, and thereafter outputs the thus input results of the comparison made in a plurality of amplifiers per one bit for each time in synchronization with clock signals.

Also in the above construction, the comparison-result output means may be composed of a counter for designating an amplifier, the result of the comparison made in which is to be output among all the amplifiers configuring the amplifier group, and a selector for outputting the result of the comparison made in the amplifier designated by the counter after inputting all the results of the comparison made in the amplifier group together.

An analog-to-digital converter according to another aspect of the present invention is constructed in such a manner that it comprises: an amplifier group for comparing a plurality of reference voltages and an analog voltage of an input analog signal, which amplifier group being composed of a plurality of amplifiers, an encoder for generating a digital code corresponding to all the results of the comparison made in each of the amplifiers of the amplifier group, and an input/output means which, when executing the test of the amplifier group, inputs all the results of the comparison made in each of the amplifiers together, and thereafter sequentially outputs the thus input results of the comparison per one bit for each time, whereas when executing the test of the encoder, electrically separates the encoder from the amplifier group, and sends test codes related to the thus input comparison results of the amplifier group to the encoder.

In the above construction, the input/output means is composed of: a shift register which, when executing the test of the amplifier group, inputs all the results of the comparison made in each of the amplifiers together, and thereafter sequentially outputs the thus input results of the comparison per one bit for each time in synchronization with clock signals, whereas, when executing the test of the encoder, inputs the test codes per one bit in synchronization with clock signals, and thereafter outputs the thus input test codes all at once to the encoder, and a connection switching means which, when executing the test of the amplifier group, connects the amplifier group to the shift register, whereas, when executing the test of the encoder, electrically separates the encoder from the amplifier group, and connects the encoder to the shift register instead.

Also in the above construction, the input/output means may be composed of: a counter which, when executing the test of the amplifier group, designates an amplifier, the result of the comparison made in which is to be output among all the amplifiers configuring the amplifier group, whereas, when executing the test of the encoder, designates a bit, a test code to which is to be input, a selection means which, when executing the test of the amplifier group, outputs the result of the comparison made in the amplifier designated by the counter after inputting all the results of the comparison made in each of the amplifiers together, whereas, when executing the test of the encoder, sequentially inputs the test codes of the bits designated by the counter, and thereafter outputs those test codes all at once, and a connection switching means which, when executing the test of the amplifier group, connects the amplifier group to the selection means, whereas when executing the test of the encoder, electrically separates the encoder from the selection means, and connects sad encoder to the selection means instead.

DETAILED DESCRIPTION OF THE PREFERRED EMBODIMENTS

Several embodiments of the present invention are now explained with reference to the accompanying figures.

First Embodiment

Figure 1:
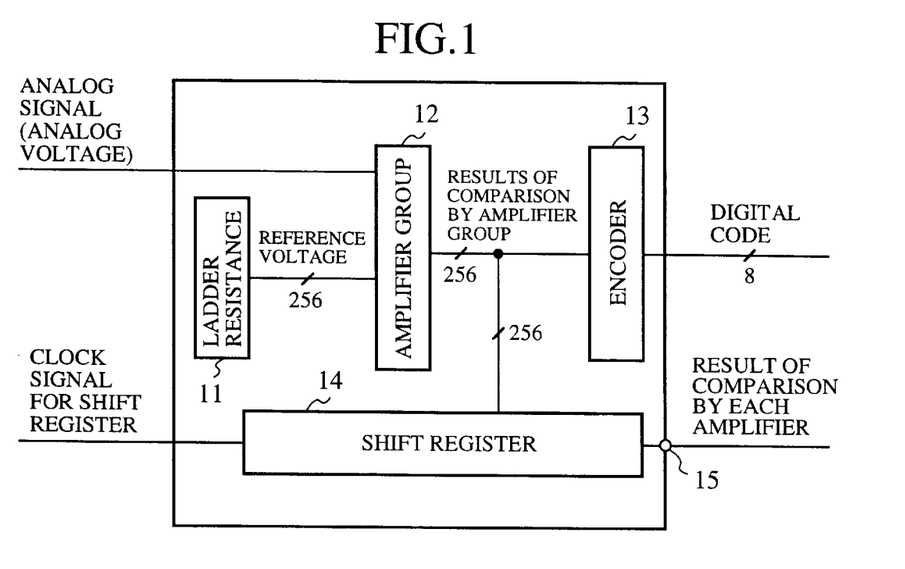
FIG. 1 is a schematic diagram showing the A/D converter according to a first embodiment of the present invention.

FIG. 1 is a schematic diagram showing the A/D converter according to a first embodiment of the present invention. In the figure, reference numeral 11 denotes a ladder resistance for generating 256 types of reference voltages, numeral 12 denotes an amplifier group composed of 256 amplifiers for comparing the analog voltage of an input analog signal that is to be A/D converted with the reference voltages, whenever an analog signal is fed thereto, numeral 13 denotes an encoder for generating an 8-bit digital code corresponding to the results of the comparison made in each of the 256 amplifiers configuring the amplifier group 12, numeral 14 denotes a shift register, which, when executing the test of the amplifier group 12, inputs all the results of the comparison made in each of the amplifiers of the amplifier group 12 together, and thereafter outputs sequentially these results of the comparison made in each of the plurality of amplifiers configuring the amplifier group 12 per one bit for each time in synchronization with a clock signal fed to the shift register (hereinafter may be referred to just as a "clock signal for shift register"), and numeral 15 denotes a one-bit output terminal.

The operation of the A/D converter according to the first embodiment of the present invention is now explained as follows.

First of all, the operation for converting an analog signal to a digital signal is explained.

When the ladder resistance 11 generates arbitrary reference voltages, the amplifier group 12 receives an analog signal to be A/D converted, and compares the analog voltage of the thus input analog signal with the reference voltages, and outputs thereafter the results of the comparison made in each of the 256 amplifiers configuring the amplifier group 12 to the encoder 13.

When the encoder 13 receives all the results of the comparison made in these 256 amplifiers, it generates an 8-bit digital code corresponding to the results of the comparison of the 256 amplifiers, and externally outputs the thus generated digital code as a digital signal representing the result of the A/D conversion.

Next, the operation for testing the amplifier group 12 is now explained as follows.

When the shift register 14 inputs a clock signal for shift register (first input clock signal), it inputs all the results of the comparison made in each of the 256 amplifiers configuring the amplifier group 12 together.

Thereafter, when the shift register 14 inputs another clock signal for shift register (second input clock signal) after inputting the results of the comparison made in each of the 256 amplifiers configuring the amplifier group 12 together, it externally outputs the result of the comparison made in the $256^{th}$ amplifier by way of the one-bit output terminal 15.

When the shift register 14 inputs further clock signal for shift register (third input clock signal), it outputs externally the result of the comparison made in the $255^{th}$ amplifier by way of the one-bit output terminal 15. In the similar manner, each time the clock signal for shift register is input, the shift register 14 repetitively outputs the results of the comparison made in different amplifiers per one bit for each time, and when it inputs the $257^{th}$ clock signal for shift register, it outputs externally the result of the comparison made in the $1^{st}$ amplifier by way of the one-bit output terminal 15.

It is to be noted that the analog voltage input for testing the amplifier group 12 is made higher than the maximum permissible voltage of the A/D converter. In this case, if all the amplifiers configuring the amplifier group 12 are functioning properly, the results of the comparison made in each of the 256 amplifiers are set to "1", so that among all the comparison results sequentially output from the shift register 14, any amplifier whose comparison result is "0" can be regarded as being faulty.

Thereafter, the analog voltage that is made lower than the minimum permissible voltage of the A/D converter is input, and on this occasion, if all the amplifiers configuring the amplifier group 12 are functioning correctly, all the results of the comparison made in each of the 256 amplifiers are set to "0", so that among all the comparison results sequentially output from the shift register 14, any amplifier whose comparison result is "1" can be regarded as being faulty. Due to this, only in the case where all the amplifiers are admitted to be correctly functioning by these two tests, the amplifier group 12 is admitted to be normal.

As is obvious from the above, since it is so arranged according to the first embodiment of the present invention that there is provided a shift register 14, which, when executing the test of the amplifier group 12, receives the results of the comparison made in each of the 256 amplifiers configuring the amplifier group 12 all at once, and sequentially outputs the thus received results per one bit for each time, the results of the comparison of all the 256 amplifiers can be directly checked, and due to this, the test of the amplifier group 12 can be executed irrespective of the functional state of the encoder 13, and thus the function of the amplifier group 12 can be correctly evaluated.

Further, in this embodiment, since the analog voltage of the input analog signal is not gradually varied as has been conventionally done, but in fact only the analog voltage higher than the permissible maximum analog voltage of the A/D converter and the one lower than the permissible minimum analog voltage of the same are to be input, the amplifier group 12 can be readily and quickly tested.

Second Embodiment

Figure 2:
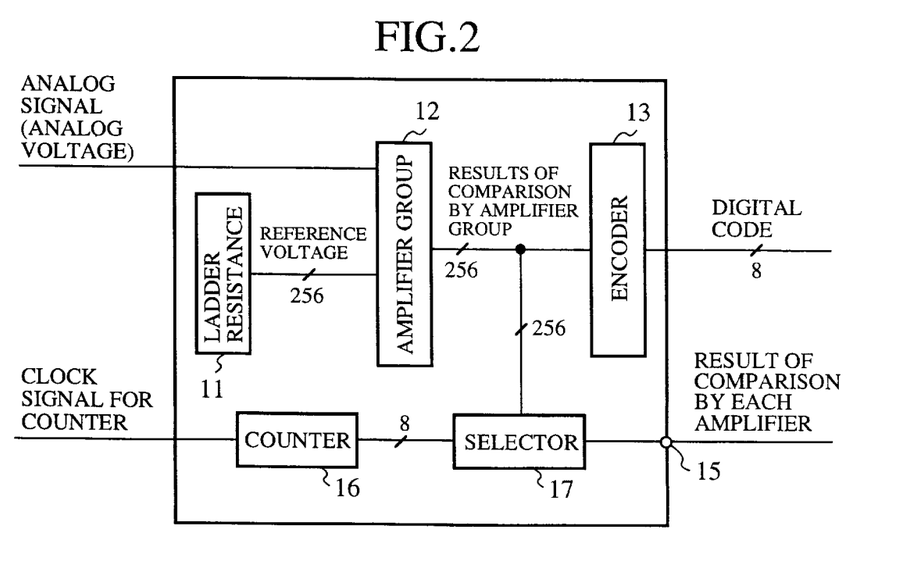
FIG. 2 is a schematic diagram showing the A/D converter according to a second embodiment of the present invention.

FIG. 2 is a schematic diagram showing the A/D converter according to a second embodiment of the present invention. In the figure, as the same reference numerals as those shown in FIG. 1 indicate the same or similar portions, the explanation thereabout is omitted.

Reference numeral 16 denotes a counter for designating an amplifier, the results of the comparison made in which is to be output among the 256 amplifiers configuring the amplifier group 12, numeral 17 denotes a selector for outputting the result of the comparison made in the amplifier designated by the counter 16 after inputting all the results of the comparison made in the amplifier group 12 together. It should be noted that the counter 16 and the selector 17 configure a comparison-result output means.

The operation of the A/D converter according to the second embodiment is as follows.

Since the operation for converting an analog signal to a digital signal is same as the one in the first embodiment, the explanation thereabout is omitted, and for this reason, only the operation for testing the amplifier group 12 is explained here.

Since the selector 17 is connected to the amplifier group 12 by 256 signal lines, when the amplifier group 12 outputs the results of the comparison made in each of the 256 amplifiers therein, all these results are output to the selector 17 together.

It should be noted that in the initial state set by the resetting operation or the like, the value indicated by the counter 16 is set to "256", so that the selector 17 outputs the result of the comparison made in the 256$^{th}$ amplifier by way of the one-bit output terminal 15. In this second embodiment, it is assumed for convenience that the selector 17 receives the comparison results of the comparison of the amplifier group 12 all at once after the initialization thereof, and externally outputs the result of the comparison made in the 256$^{th}$ amplifier.

When the counter 16 inputs a clock signal fed to the counter (hereinafter may be referred to just as a "clock signal for counter") as a first clock input, the count value of the counter 16 is decremented to "255", so that the selector 17 externally outputs the result of the comparison made in the 255$^{th}$ amplifier by way of the one-bit output terminal 15.

Further, when the counter 16 inputs another clock signal for counter (second clock input), the count value of the counter 16 is decremented to "254", so that the selector 17 externally outputs the result of the comparison made in the 254$^{th}$ amplifier by way of the one-bit output terminal 15.

In the similar manner, each time the clock signal for counter is input, the selector 17 repetitively outputs the results of the comparison made in different amplifiers per one bit for each time, and when it inputs the 255$^{th}$ clock signal for counter, it outputs externally the result of the comparison made in the 1$^{st}$ amplifier by way of the one-bit output terminal 15.

It is to be noted that the analog voltage input for testing the amplifier group 12 is made higher than the maximum permissible voltage of the A/D converter. In this case, if all the amplifiers configuring the amplifier group 12 are functioning properly, all the results of the comparison made in the 256 amplifiers are set to "1", so that among all the comparison results sequentially output from the selector 17, any amplifier whose comparison result is "0" can be regarded as being faulty.

Thereafter, the analog voltage that is made lower than the minimum permissible voltage of the A/D converter is input, and on this occasion, if all the amplifiers configuring the amplifier group 12 are correctly functioning, all the results of the comparison made in each of the 256 amplifiers are set to "0", so that among all the comparison results sequentially output from the selector 17, any amplifier whose comparison result is "1" can be regarded as being faulty. Due to this, only in the case where all the amplifiers are admitted to be correctly functioning by these two tests, the amplifier group 12 is admitted to be normal.

As is obvious from the above, since it is so arranged according to the second embodiment of the present invention that there is provided a comparison-result output means, which is configured by a counter 16 for designating an amplifier, the result of the comparison made in which is to be output among the 256 amplifiers configuring the amplifier group 12, and a selector 17 for outputting the result of the comparison made in the amplifier designated by the counter 16 after inputting all the results of the comparison made in the amplifier group 12 together, the results of the comparison made in all the 256 amplifiers can be directly chacked just like the first embodiment, and due to this, the test of the amplifier group 12 can be executed regardless of the function of the encoder 13, and thus the functional state of the amplifier group 12 can be correctly evaluated.

Further, in this embodiment, since the analog voltage of the input analog signal is not gradually varied as has been conventionally done, but in fact only the analog voltage higher than the permissible maximum analog voltage of the A/D converter and the one lower than the permissible minimum analog voltage of the same are to be input, the amplifier group 12 can be readily and quickly tested.

Third Embodiment

Figure 3:
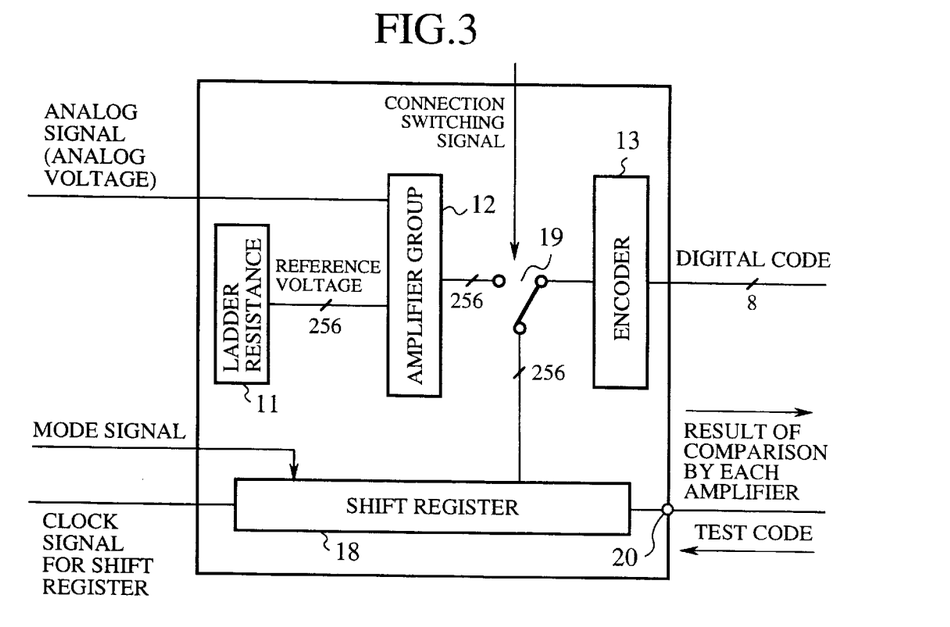
FIG. 3 is a schematic diagram showing the A/D converter according to a third embodiment of the present invention.

FIG. 3 is a schematic diagram showing the A/D converter according to a third embodiment of the present invention. In the figure, as the same reference numerals as those shown in FIG. 1 indicate the same or similar portions, the explanation thereabout is omitted.

Reference numeral 18 denotes a shift register, which, when executing the test of the amplifier group 12, inputs all the results of the comparison made in each of the 256 amplifiers all at once, and thereafter sequentially outputs those results of the comparison per one bit for each time in synchronization with a clock for shift register, whereas, when executing the test of the encoder 13, inputs all the test codes per one bit for each time in synchronization with a clock for shift register, and thereafter outputs all these test codes together. Reference numeral 19 denotes a connection switching means, which, when executing the test of the amplifier group 12, electrically separates the amplifier group 12 from the encoder 13, and connects the amplifier group 12 to the shift register 18, whereas, when executing the encoder 13, electrically separates the amplifier group 12 from the encoder 13, and connects the encoder 13 to the shift register 18. It should be noted that the shift register 18 and the switching means 19 configure an input/output means. Reference numeral 20 denotes a one-bit input/output terminal.

The operation of the A/D converter according to the third embodiment is as follows.

Since the operation for converting an analog signal to a digital signal is same as the one in the first embodiment, the explanation thereabout is omitted, and for this reason, only the operations for testing the amplifier group 12 and the encoder 13 are explained here.

First, the operation for testing the amplifier group 12 is explained.

When executing the test of the amplifier group 12, first the mode signal "1" is fed to the shift register 18, and the shift register 18 is thereby switched to the test mode of the amplifier group 12.

Thereafter, when a connection switching signal is fed to the switching means 19, the amplifier group 12 and the encoder 13 are electrically separated from each other, and the amplifier group 12 is connected to the shift register 18 instead.

Thereafter, when the shift register 18 inputs a clock signal for shift register (first clock input), all the comparison results of the comparison made in the 256 amplifiers configuring the amplifier group 12 are input together.

When the shift register 18 inputs all these results of the comparison of the 256 amplifiers and inputs also another clock signal for shift register (second clock input), it externally outputs the comparison result of the 256$^{th}$ amplifier from the one-bit input/output terminal 20, and thereafter when the shift register 18 inputs further clock signal for shift register (third clock input), it externally outputs the result of the comparison made in the 255$^{th}$ amplifier by way of the one-bit input/output terminal 20.

In the similar manner, each time the clock signal for shift register is input, the shift register 18 repetitively outputs the results of the comparison made in different amplifiers per one bit for each time, and when it inputs the 257$^{th}$ clock signal for shift register, it outputs externally the result of the comparison made in the 1$^{st}$ amplifier by way of the one-bit input/output terminal 20.

It is to be noted that the analog voltage input for testing the amplifier group 12 is made higher than the maximum permissible voltage of the A/D converter. In this case, if all the amplifiers configuring the amplifier group 12 are functioning properly, all the results of the comparison made in all the 256 amplifiers are set to "1", so that among all the comparison results sequentially output from the shift register 18, any amplifiers whose comparison result is "0" can be regarded as being faulty.

Thereafter, the analog voltage that is made lower than the minimum permissible voltage of the A/D converter is input, and on this occasion, if all the amplifiers configuring the amplifier group 12 are properly functioning, all the results of the comparison made in each of the 256 amplifiers are set to "0", so that among all the comparison results sequentially output from the shift register 18, any amplifiers whose comparison result is "1" can be regarded as being faulty. Due to this, only in the case where all the amplifiers are admitted to be functioning correctly by these two tests, the amplifier group 12 is admitted to be normal.

Next, the operation for testing the encoder 13 is explained.

When executing the test of the encoder 13, the mode signal "0" first set to the shift register 18, and the shift register 18 is thereby switched to the test mode of the encoder 13.

Thereafter, when a connection switching signal is fed to the switching means 19, the amplifier group 12 and the encoder 13 are electrically separated from each other, and the shift register 18 is connected to the encoder 13 instead.

Thereafter, when the shift register 18 inputs a clock signal for shift register (first clock input), a test code related to the 1$^{st}$ amplifier is externally input by way of the one-bit input/output terminal 20.

When the shift register 18 inputs further clock signal for shift register (second clock input), a test code related to the 2$^{nd}$ amplifier is externally input by way of the one-bit input/output terminal 20.

In the similar manner, each time the clock signal for shift register is input, the shift register 18 repetitively inputs the test codes related to different amplifiers per one bit for each time, and when it inputs the 256$^{th}$ clock signal for shift register, it inputs externally the test code related to the 256$^{th}$ amplifier by way of the one-bit input/output terminal 20.

When the shift register 18 completes the input operation of the test codes related to all the 256 amplifiers, and thereafter inputs a clock signal for shift register (the 257$^{th}$ clock input), it outputs all the test codes related to all the 256 amplifiers all at one time to the encoder 13.

Due to this operation, the encoder 13 can be tested in the state in which it is electrically isolated from the amplifier group 12, and also can be tested even by a combination of various test codes, so that the test of the encoder 13 in consideration of the built-in error correction circuit therein will be made possible.

If, for example, test codes related to the 1$^{st}$ to the 5$^{th}$ amplifiers among 256 test codes to be input to the encoder 13 are "HHHHH", "LHHHH", "LLHHH", "LLLHH", "LLLLH" and "LLLLL", then the test for distinguishing the boundary between "L" and "H" can be tested. However, if another test code such as "LLHLH" is input, the test including the error correction circuit is also made possible.

As is obvious from the above, it is so constructed according to the third embodiment of the present invention that there is provided an input/output means which, when executing the test of the amplifier group 12, receives all the results of the comparison made in each of the 256 amplifiers configuring the amplifier group 12 together, and sequentially outputs the thus received results per one bit for each time, whereas, when executing the test of the encoder 13, electrically separates the amplifier group 12 from the encoder 13, and sequentially sends the test codes related to the comparison results of the amplifier group 12 to the encoder 13, so that the results of the comparison of all the 256 amplifiers can be directly observed just like the first embodiment, and due to this, the amplifiers configuring the amplifier group 12 can be correctly tested, and the encoder 13 can also be tested correctly without being affected by the functional state of the amplifier group 12.

Further, in this embodiment, since the shift register 18 can be commonly used for testing both the amplifier group 12 and the encoder 13, the encoder 13 can be tested without providing an additional specific circuit to the construction of the first embodiment.

Fourth Embodiment

Figure 4:
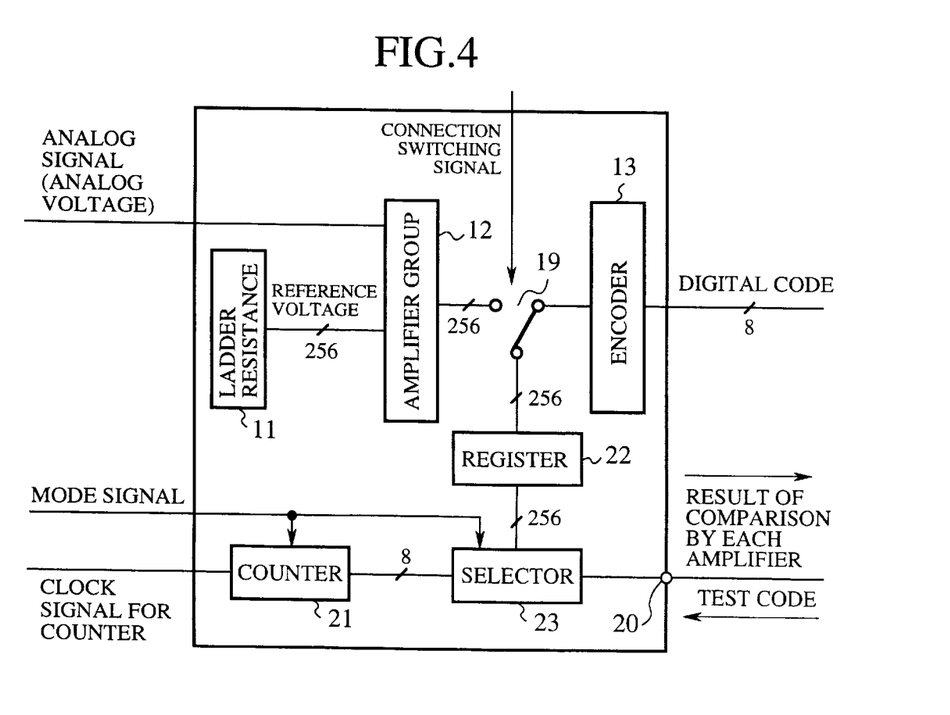
FIG. 4 is a schematic diagram showing the A/D converter according to a fourth embodiment of the present invention.

FIG. 4 is a schematic diagram showing the A/D converter according to a fourth embodiment of the present invention. In the figure, as the same reference numerals as those shown in FIG. 3 indicate the same or similar portions, the explanation thereabout is omitted.

Reference numeral 21 denotes a counter, which, when executing the test of the amplifier group 12, designates an amplifier, the result of the comparison made in which is to be output among all the 256 amplifiers configuring the amplifier group 12, whereas, when executing the test of the encoder 13, designates a bit, a test code related to which is to be input.

Reference numeral 22 denotes a register for temporally storing the results of the comparison made in each of the 256 amplifiers, or the test codes related to the 256 amplifiers, numeral 23 denotes a selector, which, when testing the amplifier group 12, inputs together all the results of the comparison made in each of the amplifier group 12 from the register 22 and outputs the result of the comparison made in an amplifier designated by the counter 21, whereas, when testing the encoder 13, sequentially inputs the test codes of the bits designated by the counter 21 and outputs all at once the thus input test codes to the register 22. Further, reference numeral 24 denotes a connection switching means, which, when testing the amplifier group 12, electrically separates the amplifier group 12 from the encoder 13, and connects the amplifier group 12 to the register 22 instead, whereas, when testing the encoder 13, electrically separates the amplifier group 12 from the encoder 13, and connects the encoder 13 to the register 22 instead.

It is to be noted that the register 22 and the selector 23 configure a selection means, and the counter 21, the selection means (register 22 and selector 23) and the switching means 24 configure an input/output means together.

The operation of the A/D converter according to the fourth embodiment of the present invention is as follows.

Since the explanation as to the operation in which an analog signal is converted to a digital signal is same as the one conducted in the first embodiment, it is omitted, so that only the operations for testing the amplifier group 12 and the encoder 13 are explained.

When executing the test of the amplifier group 12, first the mode signal "1" is fed to the selector 23, and the selector 23 is thereby switched to the test mode of the amplifier group 12.

Thereafter, when a connection switching signal is fed to the switching means 24, the amplifier group 12 is electrically separated from the encoder 13, and the amplifier group 12 is connected to the register 22 instead.

When the amplifier group 12 outputs the results of the comparison due to this operation, those results are stored in the register 22, whereby the selector 23 inputs all the comparison results of the amplifier group 12 together from the register 22.

It is to be noted that when the mode signal of the signal level "1" is input, the counter sets its value to "256", so that the selector 23 externally outputs the comparison result of the $256^{th}$ amplifier by way of the one-bit input/output terminal 20.

When the counter 21 inputs a clock signal for counter (first cloak input), the count value of the counter 21 is decremented to "255", so that the selector 23 externally outputs the comparison result of the $255^{th}$ amplifier by way of the one-bit input/output terminal 20.

Further, when the counter 21 inputs another clock signal for counter (second clock input), the count value of the counter 21 is decremented to "254", so that the selector 23 externally outputs the comparison result of the $254^{th}$ amplifier by way of the one-bit input/output terminal 20.

In the similar manner, each time the clock signal for counter is input, the selector 23 repetitively outputs the results of the comparison made in different amplifiers per one bit for each time, and when it inputs the $255^{th}$ clock signal for counter, it outputs externally the result of the comparison made in the $1^{st}$ amplifier by way of the one-bit input/output terminal 20.

It is to be noted that the analog voltage input for testing the amplifier group 12 is made higher than the maximum permissible voltage. In this case, if all the amplifiers configuring the amplifier group 12 are functioning properly, all the results of the comparison made in all the 256 amplifiers are set to "1", so that among all the comparison results sequentially output from the selector 23, any amplifier whose comparison result is "0" can be regarded as being faulty.

Thereafter, the analog voltage that is lower than the minimum permissible voltage of the A/D converter is input, and on this occasion, if all the amplifiers configuring the amplifier group 12 are functioning properly, all the results of the comparison made in all the 256 amplifiers are set to "0", so that among all the comparison results sequentially output from the selector 23, any amplifier whose comparison result is "1" can be regarded as being faulty. Due to this, only in the case where all the amplifiers are admitted to be functioning properly by these two tests, the amplifier group 12 is admitted to be normal.

Next, the operation for testing the encoder 13 is explained.

When executing the test of the encoder 13, first the mode signal "0" is fed to the selector 23, and the selector 23 is thereby switched to the test mode of the encoder 13.

Thereafter, when a connection switching signal is fed to the switching means 24, the amplifier group 12 is electrically separated from the encoder 13, and the encoder 13 is connected to the shift register 22 instead.

Thereafter when the selector 23 inputs the mode signal "0", the value of the counter 21 sets its value to "1", so that the selector 23 externally inputs a test code related to the $1^{st}$ amplifier by way of the input/output terminal 20.

Thereafter, when the selector 23 inputs a clock signal for counter (first clock input), the count value of the counter 21 is incremented to "2", so that the selector 23 inputs externally a test code related to the $2^{nd}$ amplifier by way of the one-bit input/output terminal 20.

When the selector 23 further inputs another clock signal for counter (second clock input), the count value of the counter 21 is incremented to "3", so that the selector 23 externally inputs the test code related to the $3^{rd}$ amplifier by way of the one-bit input/output terminal 20.

In the similar manner, each time the clock signal for counter is input, the selector 23 repetitively inputs the test codes related to different amplifiers per one bit for each time, and when it inputs the 255$^{th}$ cloak signal for counter, it inputs externally the test code related to the 256$^{th}$ amplifier by way of the one-bit input/output terminal 20.

After the selector 23 completes the input operation of the test codes related to all the 256 amplifiers, if it inputs a clock for counter (the 256$^{th}$ clock input), it outputs all the test codes related to all these 256 amplifiers together to the encoder 13 by way of the register 22.

Due to this operation, the encoder 13 can be tested individually in a state in which it is electrically separated from the amplifier group 12, and it also can be tested even by a combination of various test codes, so that the test of the encoder 13 in consideration of the built-in error correction circuit therein win be made possible, and accordingly, the effect obtained in the third embodiment can be equally obtained by this fourth embodiment as well.

As is explained heretofore, since it is so arranged according to the present invention that there is provided a comparison-result output means which, when executing the test of the amplifier group, inputs all the results of the comparison made in each of the amplifiers configuring the amplifier group together, and sequentially outputs the thus received results per one bit for each time, the functional state of the amplifier group 12 can be correctly evaluated regardless of the functional state of the encoder.

According to the present invention, since it is arranged such that there is provided a comparison-result output means configured by a shift register that first inputs results of the comparison made in the amplifier group all at once, and thereafter outputs the thus input results of the comparison made in a plurality of amplifiers per one bit for each time in synchronization with the clock signals, the comparison results of the amplifier group can be output without making the whole construction complicated.

According to the present invention, since it is arranged such that there is provided a comparison-result output means, which is configured by a counter for designating an amplifier, the result of the comparison made in which is to be output among a plurality of amplifiers configuring the amplifier group, and a selector for outputting the result of the comparison made in the amplifier designated by the counter after inputting the results of the comparison made in the amplifier group together, the comparison results of the amplifier group can be output without making the whole construction complicated.

Further, according to the present invention, since it is arranged such that there is provided an input/output means which, when executing the test of the amplifier group, receives all the results of the comparison made in the amplifier group together, and thereafter sequentially outputs the thus received results per one bit for each time, whereas when executing the test of the encoder, electrically separates the amplifier group from the encoder, and sequentially sends the test codes related to the comparison results of the amplifier group to the encoder, the amplifiers configuring the amplifier group can be correctly tested, and the encoder can also be tested correctly.

Further according to the present invention, it is arranged such that there is provided an input/output means comprising: a shift register which, when executing the test of the amplifier group, receives all the results of the comparison made in the amplifier group together, and thereafter sequentially outputs the thus received results of the comparison made in a plurality of amplifiers per one bit for each time in synchronization with the clock signals, whereas when executing the test of the encoder, receives the test codes per one bit in synchronization with the clock signals, and thereafter outputs the thus received test codes all at once, and also a connection switching means which, when executing the test of the amplifier group, connects the amplifier group to the shift register, whereas when executing the test of the encoder, electrically separates the amplifier group from the shift register, and connects the encoder to the shift register instead. Due to this, the results of the comparison made in the amplifier group can be externally output and the test codes to be fed to the encoder can also be externally input, without making the whole construction complicated.

Still further, it is arranged according to the present invention such that there is provided an input/output means comprising: a counter which, when executing the test of the amplifier group, designates an amplifier, the result of the comparison made in which is to be output among a plurality of amplifiers configuring the amplifier group, whereas when executing the test of the encoder, designates a bit, a test code to which is to be input, a selection means which, when executing the amplifier group, outputs the result of the comparison made in the amplifier designated by the counter after inputting all the results of the comparison made in the amplifier group together, whereas when executing the test of the encoder, inputs the test codes designated by the counter, and thereafter outputs those test codes all at once, and a connection switching means, which, when executing the test of the amplifier group, connects the amplifier to the selection means, whereas when executing the test of the encoder, electrically separates the encoder from the selection means. Due to this, the results of the comparison made in the amplifier group can be externally output and the test codes to be fed to the encoder can also be externally input, without making the whole construction complicated.

What is claimed is:

1. An analog-to-digital converter comprising:
   an amplifier group for comparing a plurality of reference voltages with an analog voltage of an input analog signal, said amplifier group being composed of a plurality of individual amplifiers,
   an encoder for generating a digital code corresponding to the results of the comparison made in each of the amplifiers of said amplifier group, and
   a comparison-result output means which, when executing a test of said amplifier group, inputs all the results of the comparison made in each of the amplifiers together, and sequentially outputs these comparison results per one bit for each time.

2. An analog-to-digital converter according to claim 1, wherein said comparison-result output means is composed of a shift register that first inputs all the results of the comparison made in said amplifier group together, and thereafter outputs the thus input results of the comparison made in a plurality of amplifiers per one bit for each time in synchronization with cloak signals.

3. An analog-to-digital converter according to claim 1, wherein said comparison-result output means is composed of a counter for designating an amplifier corresponding to a value of said counter, the result of the comparison made in which is to be output among all the amplifiers configuring said amplifier group, and a selector for outputting the result of the comparison made in the amplifier designated by said counter after inputting all the results of the comparison made in said amplifier group together.

4. An analog-to-digital converter comprising:
   an amplifier group for comparing a plurality of reference voltages and an analog voltage of an input analog signal, said amplifier group being composed of a plurality of amplifiers, an encoder for generating a digital code corresponding to all the results of the comparison made in each of the amplifiers of said amplifier group, and an input/output means which, when executing a test of the amplifier group, inputs all the results of the comparison made in each of the amplifiers together, and thereafter sequentially outputs the thus input results of the comparison per one bit for each time, whereas when executing a test of said encoder, electrically separates said encoder from said amplifier group, and sends test codes related to the thus input comparison results of said amplifier group to said encoder.

5. An analog-to-digital converter according to claim 4, wherein said input/output means is composed of:

a shift register which, when executing the test of the amplifier group, inputs all the, results of the comparison made in each of the amplifiers together, and thereafter sequentially outputs the thus input results of the comparison per one bit for each time in synchronization with clock signals, whereas, when executing the test of the encoder, inputs the test codes per one bit in synchronization with clock signals, and thereafter outputs the thus input test codes all at once to said encoder, and a connection switching means which, when executing the test of the amplifier group, connects said amplifier group to said shift register, whereas, when executing the test of the encoder, electrically separates said encoder from said amplifier group, and connects said encoder to said shift register instead.

6. An analog-to-digital converter according to claim 4, wherein said input/output means is composed of:

a counter which, when executing the test of said amplifier group, designates an amplifier corresponding to a value of said counter, the result of the comparison made in which is to be output among all the amplifiers configuring said amplifier group, whereas, when executing the test of the encoder, designates a bit, a test code to which is to be input, a selection means which, when executing the test of the amplifier group, outputs the result of the comparison made in the amplifier designated by said counter after inputting all the results of the comparison made in each of the amplifiers together, whereas, when executing the test of the encoder, sequentially inputs the test codes of the bits designated by said counter, and thereafter outputs those test codes all at once, and a connection switching means which, when executing the test of the amplifier group, connects said amplifier group to said selection means, whereas when executing the test of the encoder electrically separates said encoder from said selection means, and connects said encoder to said selection means instead.

7. An analog-to-digital converter according to claim 6 wherein said selection means further comprises:

a register for temporally storing the results of the comparison made in each of the amplifiers configuring said amplifier group, or the test codes related to these amplifiers, and a selector, which, when executing the test of said amplifier group, inputs all the results of the comparison made in each of the amplifiers together from said register and outputs the result of the comparison made in an amplifier designated by said counter, whereas, when executing the test of the encoder, sequentially inputs the test codes of the bits designated by said counter and outputs all at once the thus input test codes to said encoder by way of said register.

* * * * *

UNITED STATES PATENT AND TRADEMARK OFFICE
CERTIFICATE OF CORRECTION

PATENT NO. : 6,373,420 B1
DATED : April 16, 2002
INVENTOR(S) : Hisashi Harada

It is certified that error appears in the above-identified patent and that said Letters Patent is hereby corrected as shown below:

<u>Title page,</u>
Item [54], the title is corrected to read:
-- ANALOG-TO-DIGITAL CONVERTER WITH CAPABILITY OF OUTPUTTING COMPARISON RESULTS ONE BIT AT A TIME DURING TESTING --

Signed and Sealed this

Twenty-eighth Day of January, 2003

JAMES E. ROGAN
*Director of the United States Patent and Trademark Office*